United States Patent
Lin et al.

(10) Patent No.: US 9,912,306 B1
(45) Date of Patent: Mar. 6, 2018

(54) POWER SUPPLY CIRCUIT OF WIRELESS MOBILE DEVICE

(71) Applicant: MEDIATEK Inc., Hsin-Chu (TW)

(72) Inventors: Shih-Mei Lin, Taipei (TW); Chien-Wei Kuan, Zhubei (TW); Chen-Yen Ho, New Taipei (TW); Che-Hao Meng, New Taipei (TW); Tso-Min Chen, Hsinchu (TW); Chia-Sheng Peng, Taichung (TW); Sheng-Hong Yan, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/492,013

(22) Filed: Apr. 20, 2017

Related U.S. Application Data

(60) Provisional application No. 62/374,035, filed on Aug. 12, 2016.

(51) Int. Cl.
*H04B 1/38* (2015.01)
*H04M 1/00* (2006.01)
(Continued)

(52) U.S. Cl.
CPC .............. *H03F 3/20* (2013.01); *H02M 3/158* (2013.01); *H03F 3/68* (2013.01);
(Continued)

(58) Field of Classification Search
CPC ........ H03F 1/0277; H03F 3/189; H03F 3/211; H03F 2200/27; H03F 2200/451;
(Continued)

(56) References Cited

U.S. PATENT DOCUMENTS 6,774,725 B2 *  8/2004  Miki ................... H03F 1/0211
                                                         330/297
8,035,362 B2 * 10/2011  Blanken ............. H03F 1/0211
                                                         330/297
(Continued)

FOREIGN PATENT DOCUMENTS

JP        2014187432 A      10/2014

OTHER PUBLICATIONS

EPO Search Report dated Dec. 14, 2017 in EP application (No. 17174786.8-1805).

*Primary Examiner* — Quochien B Vuong
(74) *Attorney, Agent, or Firm* — McClure, Qualey & Rodack, LLP

(57) ABSTRACT

Provided is a power supply circuit for a wireless mobile device having a plurality of power amplification components. The power supply circuit includes: a first DC-DC converter, for providing at least one constant output voltage (which is provided to the power amplification components) and/or at least one DC intermediate voltage; a second DC-DC converter, for providing a DC component of at least one time-varying output voltage; and at least one linear amplifier. When the at least one linear amplifier receives the at least one DC intermediate voltage from the first DC-DC converter, the at least one linear amplifier provides at least one AC component of the at least one time-varying output voltage. The DC component and the at least one AC component of the at least one time-varying output voltage are combined into the at least one time-varying output voltage and provided to the power amplification components.

14 Claims, 4 Drawing Sheets

(51) Int. Cl.
*H03F 3/04* (2006.01)
*H03F 3/20* (2006.01)
*H02M 3/158* (2006.01)
*H03F 3/68* (2006.01)

(52) U.S. Cl.
CPC .. *H03F 2200/102* (2013.01); *H03F 2200/105* (2013.01); *H03F 2200/432* (2013.01)

(58) Field of Classification Search
CPC ... H03F 2200/555; H04B 1/40; H04B 1/1607; H04B 7/26; H04B 2001/045; H04B 2001/0408; H04B 2201/0416; H03G 3/004
USPC ......... 455/127.1, 127.2, 127.3, 127.4, 552.1, 455/553.1, 572; 330/296, 297
See application file for complete search history.

(56) References Cited

U.S. PATENT DOCUMENTS

| | | | | |
|---|---|---|---|---|
| 8,224,399 B2* | 7/2012 | Lee | ...................... | H04B 1/1607 455/127.1 |
| 8,253,485 B2* | 8/2012 | Clifton | .................. | H03F 1/0222 330/277 |
| 8,289,084 B2* | 10/2012 | Morimoto | ............. | H03F 1/0216 330/296 |
| 2013/0141068 A1 | 6/2013 | Kay et al. | | |
| 2014/0266462 A1 | 9/2014 | Schirmann et al. | | |
| 2014/0273897 A1 | 9/2014 | Drogi et al. | | |
| 2015/0045095 A1* | 2/2015 | D'Souza | ................. | H03F 3/187 455/572 |
| 2016/0065139 A1 | 3/2016 | Lee et al. | | |
| 2016/0173031 A1 | 6/2016 | Langer | | |

* cited by examiner

POWER SUPPLY CIRCUIT OF WIRELESS MOBILE DEVICE

This application claims the benefit of U.S. provisional Patent application Ser. No. 62/374,035, filed Aug. 12, 2016, the disclosure of which is incorporated by reference herein in its entirety.

BACKGROUND

Technical Field

The disclosure relates in general to a power supply circuit for wireless mobile device having a plurality of multi-mode power amplification components.

Description of the Related Art

Wireless mobile devices (for example, smart phones) are increasingly required to operate in multiple modes, e.g. Global System for Mobile Communications (GSM), General Packet Radio Service (GPRS), code division multiple access (CDMA), wideband CDMA (WCDMA) and long term evolution (LTE). Wireless handsets are also increasingly required to operate in multiple frequency bands (e.g. 700, 800, 900, 1700, 1800, 1900, 2100, and 2600 MHz bands).

Multi-mode and multi-band wireless mobile devices typically contain a plurality of power amplifiers (PA) for each individual mode and each individual operation band. For example, a quad-band GSM and tri-band WCDMA mobile device will often have one GSM power amplifier covering digital cellular service (DCS) and personal communications service (PCS) bands, one GSM power amplifier covering United States cellular and European cellular bands, one WCDMA power amplifier for United States cellular band, one WCDMA power amplifier for PCS band, and one WCDMA power amplifier for International Mobile Telecommunications-2000 (IMT-2000) band.

Wireless mobile devices use dedicated power amplifier circuits for each band and each mode to optimize input and output matches to achieve the best linearity and/or efficiency for the given mode or band of operation. Some power amplifiers prefer ET (envelop tracking) for better efficiency while others prefer APT (average power tracking) for wider bandwidth.

Therefore, there is a need in the art for an improved power supply circuit to supply power to multi-mode power amplifiers with less cost and more flexibility.

SUMMARY

According to one embodiment, provided is a power supply circuit for a wireless mobile device. The wireless mobile device includes a plurality of power amplification components, each power amplification component of a first subset of the power amplification components is configured to operate according to an APT (average power tracking) mode and each power amplification component of a second subset of the power amplification components is configured to operate according to either an ET (envelop tracking) mode or the APT mode. The power supply circuit includes: a first DC (direct current)-DC converter, coupled to the first subset of the power amplification components, the first DC-DC converter being configured to provide a plurality of APT output voltages and/or a plurality of DC intermediate voltages, the plurality of APT output voltages being provided to the first subset of the power amplification components, respectively; a second DC-DC converter, coupled to the first DC-DC converter and the second subset of the power amplification components, the second DC-DC converter being configured to provide a plurality of DC components of a plurality of ET output voltages; a plurality of linear amplifiers, coupled to the first DC-DC converter and the second subset of the power amplification components; and a plurality of bypass switches, coupled to the first DC-DC converter and the second subset of the power amplification components, for bypassing the plurality of DC intermediate voltages directly to the second subset of the power amplification components when the second subset of the power amplification components are to be operated under the APT mode. When the plurality of linear amplifiers receive the plurality of DC intermediate voltages from the first DC-DC converter, the plurality of linear amplifiers provide a plurality of AC components of the plurality of ET output voltages, respectively. The plurality of DC components of the plurality of ET output voltages and the plurality of AC components of the plurality of ET output voltages are combined into the plurality of ET output voltages, respectively and the plurality of ET output voltages are provided to the second subset of the power amplification components, respectively.

According to another embodiment, provided is a power supply circuit for a wireless mobile device having a plurality of power amplification components. The power supply circuit includes: a first DC-DC converter, coupled to the power amplification components, the first DC-DC converter being configured to provide at least one constant output voltage and/or at least one DC intermediate voltage, the at least one constant output voltage being provided to the power amplification components; a second DC-DC converter, coupled to the first DC-DC converter and the power amplification components, the second DC-DC converter being configured to provide a DC component of at least one time-varying output voltage; and at least one linear amplifier, coupled to the first DC-DC converter and the power amplification components. When the at least one linear amplifier receives the at least one DC intermediate voltage from the first DC-DC converter, the at least one linear amplifier provides at least one AC component of the at least one time-varying output voltage. The DC component of the at least one time-varying output voltage and the at least one AC component of the at least one time-varying output voltage are combined into the at least one time-varying output voltage and provided to the power amplification components.

Figure 1:
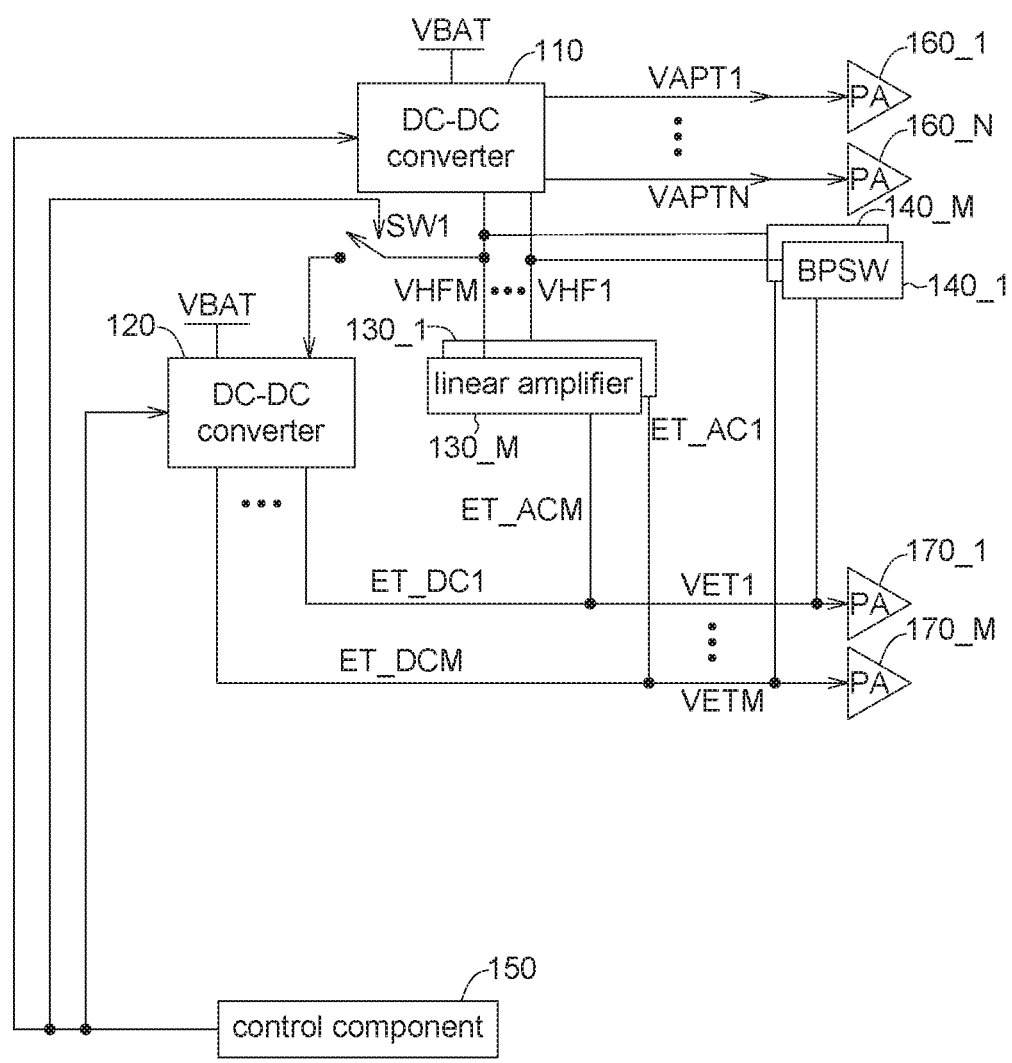
FIG. 1 shows a power supply circuit according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a power supply circuit according to one embodiment of the application is shown. The power supply circuit 100 includes a first DC (direct current)-DC converter 110, a second DC-DC converter 120, a plurality of linear amplifiers 130_1-130_M (M is a natural number and is larger than or equal to 1), bypass switches 140_1-140_M and a control component 150. The power supply circuit 100 further includes a switch SW1 to control whether the output from the first DC-DC converter 110 is allowed to be conducted to the second DC-DC converter 120. The power supply circuit 100 may provide power to power amplifiers 160_1-160N (N is a natural number and is larger than or equal to 1) and 170_1-170_M. In other words, the power amplifiers 160_1-160_N and 170_1-170M may include a first subset and a second subset, the first subset including the power amplifiers 160_1-160_N and the second subset including the power amplifiers 170_1-170_M. Each of the first subset of the power amplifiers 160_1-160_N is configured to operate according to an APT (average power tracking) mode. Each of the second subset of the power amplifiers 170_1-170_M can be configured to operate both according to ET (envelop tracking) mode or APT mode.

The first DC-DC converter 110 may be configured to provide at least one APT output voltage (wherein the APT output voltage is a constant voltage) which may be provided to at least one of the first subset (i.e. the power amplifiers 160_1-160_N) of the power amplifiers. In more details, in one of the operation modes of the power supply circuit of the embodiment of the application, the first DC-DC converter 110 may be configured to provide N APT output voltages VAPT1-VAPTN to provide to N power amplifiers 160_1-160_N, respectively. The power supply circuit of the embodiment of the application may determine the APT output voltage based on system performance and the APT output voltage may be constant for a period of time.

The second DC-DC converter 120 is coupled to the second subset (i.e. the power amplifiers 170_1-170_M) of the power amplifiers. When the power supply circuit 100 is required to provide at least one ET output voltage (the ET output voltage may be a timing-varying voltage), the first DC-DC converter 110, the second DC-DC converter 120 and the linear amplifiers 130_1-130_M will be operated to provide the at least one ET output voltage. In more details, in another one of the operation modes of the power supply circuit of the embodiment of the application, the first DC-DC converter 110, the second DC-DC converter 120 and the linear amplifiers 130_1-130_M may operate to provide at most M ET output voltages VET1-VETM to provide to M power amplifiers 170_1-170_M which are operated in ET mode, respectively. The power supply circuit of the embodiment of the application may determine the ET output voltage based on output power of the ET PAs through a mapping function.

The first DC-DC converter 110 provides a DC intermediate voltage VHF1 to the second DC-DC converter 120; and further the first DC-DC converter 110 provides DC intermediate voltages VHF1-VHFM to the linear amplifiers 130_1-130_M, respectively. Thus, the first DC-DC converter 110 may be a SIMO (single inductor multiple outputs) circuit configuration, and of course, the application is not limited by this.

The second DC-DC converter 120 converts the DC intermediate voltage VHF1 from the first DC-DC converter 110 into M DC ET voltages ET_DC1-ET_DCM.

The linear amplifiers 130_1-130_M provide M AC ET voltages ET_AC1-ET_ACM, respectively. Details of the circuit configuration and operations of the linear amplifiers 130_1-130_M are not specified here.

In details, M DC ET voltages ET_DC1-ET_DCM are combined with the respective one of the M AC ET voltages ET_AC1-ET_ACM into each of the M ET output voltages VET1-VETM, respectively. For example, the DC ET voltage ET_DC1 is combined with the AC ET voltage ET_AC1 from the linear amplifier 130_1 into the ET output voltage VET1; and the DC ET voltage ET_DCM is combined with the AC ET voltage ET_ACM from the linear amplifier 130_M into the ET output voltage VETM. The M DC ET voltages ET_DC1-ET_DCM are DC components of the ET output voltages VET1-VETM, respectively. The AC ET voltages ET_AC1-ET_ACM are AC components of the ET output voltages VET1-VETM, respectively.

The control component 150 is configured to control switch operations of the first DC-DC converter 110 and the second DC-DC converter 120.

The bypass switches 140_1-140_M are used to bypass the output voltages VHF1-VHFM directly from the first DC-DC converter 110 to the power amplifiers 170_1-170_M, respectively if APT mode in the second subsets of PAs is needed. In other words, when any one of the power amplifiers 170_1-170_M is to be operated under APT mode, the corresponding linear amplifier will not operate and the second DC-DC converter 120 will not supply the corresponding DC ET voltage (ET_DC1-ET_DCM), while the corresponding one of the bypass switches 140_1-140_M will be in connection states to bypass the corresponding one of the voltages VHF1-VHFM directly from the first DC-DC converter 110 to the corresponding one of the power amplifiers 170_1-170_M, respectively. When any one of power amplifiers 170_1-170_M is to be operated under ET mode, the corresponding one of the bypass switches 140_1-140_M will be in disconnection states and the corresponding one of the voltages VHF1-VHFM from the first DC-DC converter 110 will be received by the linear amplifiers 130_1-130_M, respectively, to supply the linear amplifier to provide AC power ET_AC to the power amplifier while the DC power will be supply from one of the M DC ET voltages ET_DC1-ET_DCM from the second DC-DC converter 120.

Figure 2:
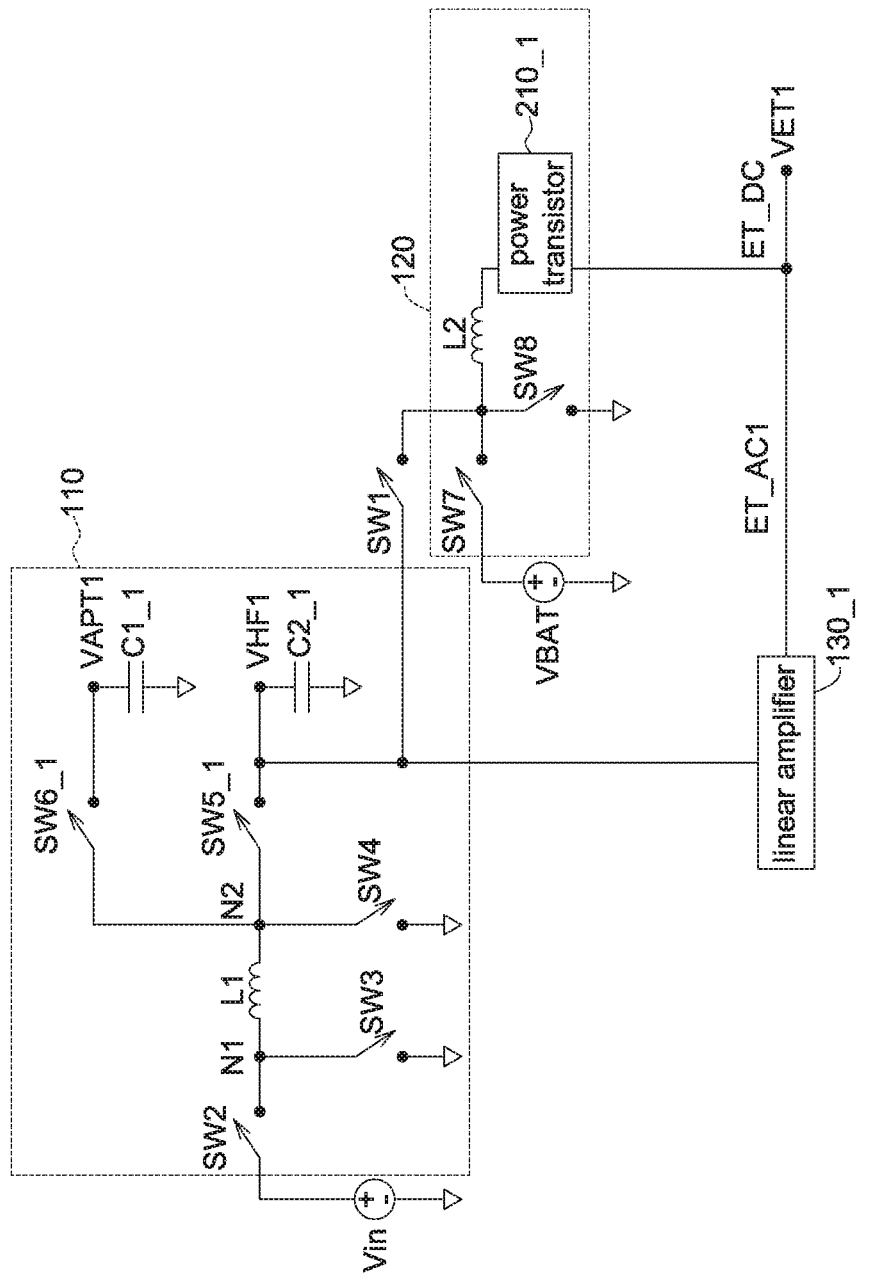
FIG. 2 shows a circuit diagram for a power supply circuit according to one embodiment of the application.

FIG. 2 shows a circuit diagram for the power supply circuit 200 according to one embodiment of the application. As shown in FIG. 2, the first DC-DC converter 110, for example, may be implemented by a buck-boost DC converter.

When the voltage source VBAT is not high enough, the switch SW7 is turned off and the switches SW1 and SW8 are toggled complementary based on the duty produced by the control component 150. On the contrary, when the voltage source VBAT is high enough, the switches SW1 is turned OFF and the switches SW7 and SW8 are toggled complementary based on the duty produced by the control component 150 to produce the desired DC voltage.

The situation when the power supply circuit 200 is required to generate an APT output voltage VAPT1 and an ET output voltage VET1 is described as follows. Under control of the control component 150 (which is not shown in FIG. 2 for simplicity), in the first DC-DC converter 110, it is arranged to receive an input voltage Vin from a battery or any other supply voltage provider to generate a stable output voltage Vout at an output node. The first DC-DC converter 110 (which may be a buck-boost converter) includes switches SW2, SW3, SW4, SW5_1-SW5_M and SW6_1-SW6_N, an inductor L, and capacitors C1_1-C1_N and C2_1-C2_M. M and N are the number of the outputs VHF and VAPT of the first DC-DC converter 110. Although in FIG. 2, M and N are both 1 but the application is not limited by. The switch SW2 is coupled between the input voltage Vin and a first terminal N1 of the inductor L. The switch SW3 is coupled between the first terminal N1 of the inductor L and a reference voltage VSS (in this embodiment, the reference voltage is a ground voltage). The switches SW5_1 to SW5_M are coupled between a second terminal N2 of the inductor L and the respective one of the output voltages VHF1-VHFM. The switches SW6_1 to SW6_N are coupled between the second terminal N2 of the inductor L and the respective one of the output voltages VAPT1-VAPTN. The SW4 is coupled between the second terminal N2 of the inductor L and the reference voltage. The capacitors C1_1-C1_N are coupled between VSS and the respective one of the switch SW6_1-SW6_N and the capacitors C1_1-C1_N hold the APT output voltages VAPT1-VAPTN. The capacitors C2_1-C2_M are coupled between VSS and the respective one of the switch SW5_1-SW5_M, and the capacitors C2_1-C2_M hold the DC intermediate voltages VHF1-VHFM.

The first DC-DC converter 110 may generate the output voltages higher or lower than the input voltage Vin. For example, when the first DC-DC converter operates in the buck mode, the control component 150 generates the control signals to control the switches SW2 and SW3, respectively, to make the switches SW2 and SW3 to turn on and off alternately, and the switches SW2 and SW3 are not turned on simultaneously. The control component 150 further generates the control signals to turn on and turn off the switches SW5_1-SW5_M and SW6_1-SW6_N, and further generates the control signal to always turn off the switch SW4 for generating the proper step down output voltages. By this, the first DC-DC converter 110 generates the APT output voltages VAPT1-VAPTN and the DC intermediate voltages VHF1-VHFM. Because the second DC-DC converter 120 is to be operated for generating output voltage, the DC intermediate voltage VHF1 from the first DC-DC converter 110 or the voltage source VBAT is used by the second DC-DC converter 120 via the switches SW1 or SW7, based on whether the voltage source VBAT is high enough or not.

Also, in the second DC-DC converter 120, by switching the switches SW1 and SW8 or by switching the switches SW7 and SW8 according to the duty cycle signal generated from the control component 150, the second DC-DC converter 120 generates the M DC ET output voltage ET_DC1-ET_DCM.

The linear amplifier 130_1-130_M produce the M AC ET voltages ET_AC1-ET_ACM. Thus, via the AC coupled capacitor, and by switching multiple output power transistors (for example, the power transistor 210_1 in FIG. 2) according to the output voltage acquired for DC voltage levels, the second DC-DC converter 120 generates M DC ET output voltages ET_DC1-ET_DC_M.

Also, in FIG. 2, the second DC-DC converter 120 further includes power transistors 210_1-210_M. In SIMO buck structure, multiple outputs voltages may be produced by switching inductor current into several paths. Each of the power transistors 210_1-210-M conducts inductor current for a fraction of the time to avoid short circuiting the outputs. The DC-DC converter charges and discharges the inductor from input to one of the M DC ET voltages ET_DC1-ET_DCM at a time. In steady state, the average voltage across the inductor L2 is zero, by determining the ON duty of the switch SW7 (or the switch SW1 if in low battery state) and each of the power transistors 210_1-210_M. The ON duty of the switch SW7 (or the switch SW1 if in low battery state) will be the summation of the ON duty of the power transistors 210_1-210_M.

The second DC-DC converter 120 may be also a SIMO circuit configuration for generating a plurality of different ET DC output voltages ET_DC1-ET_DC_M.

Figure 3:
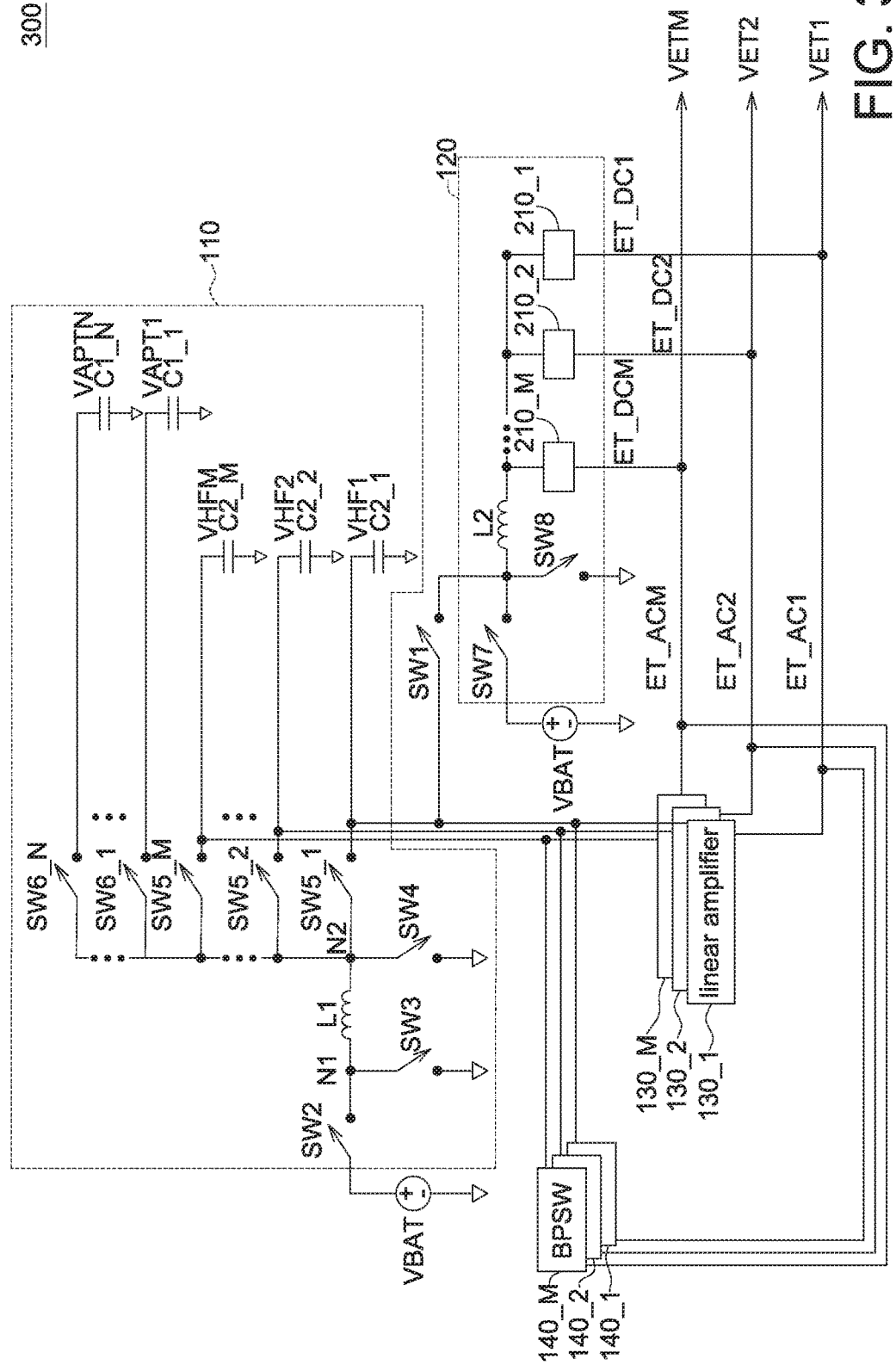
FIG. 3 shows a circuit diagram for a power supply circuit according to one embodiment of the application.

FIG. 3 shows a circuit diagram for the power supply circuit 300 according to one embodiment of the application. As shown in FIG. 3, the first DC-DC converter 110, for example, may be implemented by a SIMO buck-boost DC converter. The circuit configuration of the power supply circuit 300 is similar to that of the power supply circuit 200 of FIG. 2 and thus the details are omitted here.

Figure 4:
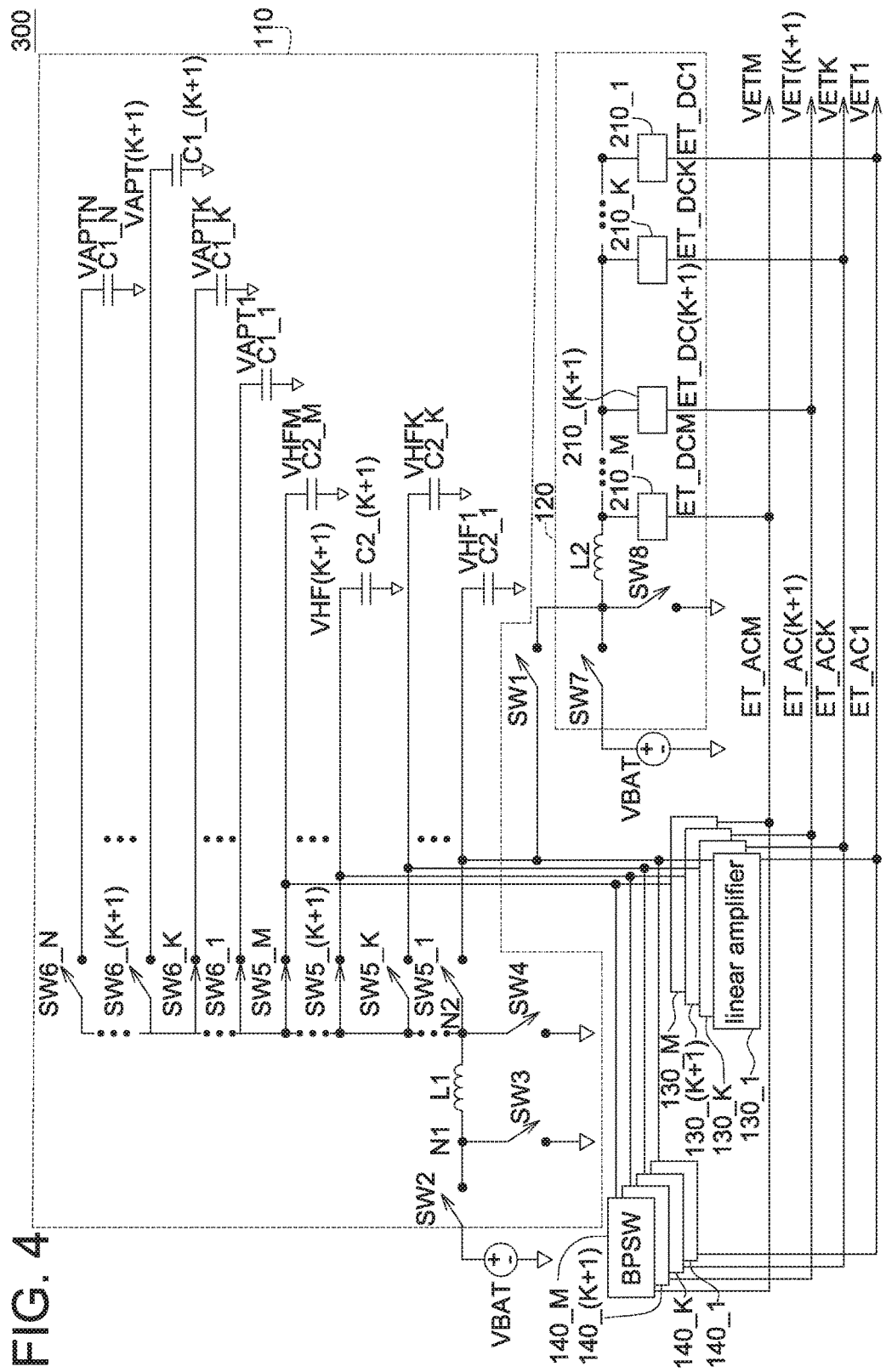
FIG. 4 shows switching conditions of the switches of the power supply circuit of FIG. 3.

The situation when the power supply circuit 300 is required to generate K (K being a natural number and K≤M) APT output voltages VAPT1-VAPTK and (M−K) ET output voltages VET(K+1)-VETM is described as follows, with reference to FIG. 4. FIG. 4 shows switching conditions of the switches of the power supply circuit 300 of FIG. 3. Under control of the control component 150 (which is not shown in FIG. 3 and FIG. 4 for simplicity), in the first DC-DC converter 110, the switches SW2 and SW3 will toggle simultaneously according to the first duty control signal from the control component 150, to make the switches SW2 and SW3 to turn on and off alternately; and the switch SW4 and the rest of the switches SW5_1-SW5_M and SW6_1-SW6-N will toggle simultaneously according to multiple duty control signal related to each of the output voltage's condition, but each of the other switches will not turn on at the same time. By this, the first DC-DC converter 110 generates the APT output voltages VAPT1-VAPTK and the DC intermediate voltages VHF(K+1)-VHFM. In other words, the first DC-DC converter 110 does not provide the APT output voltages VAPT(K+1)-VAPTN and the DC intermediate voltages VHF1-VHFK.

Because the second DC-DC converter 120 is to be operated for generating output voltage, the DC intermediate voltage VHF1 from the first DC-DC converter 110 or the voltage source VBAT is used by the second DC-DC converter 120 via the switches SW1 or SW7, based on whether the voltage source VBAT is high enough or not.

Also, in the second DC-DC converter 120, by switching the switches SW1 and SW8 or by switching the switches SW7 and SW8 according to the duty cycle signal generated from the control component 150, and by switching multiple output switches according to the output voltage acquired for DC voltage levels, the second DC-DC converter 120 generates M DC ET output voltages ET_DC1-ET_DC_M.

The linear amplifiers 130_(K+1)-130_M produce the AC ET voltage ET_AC(K+1)-ET_ACM, respectively. Because the first DC-DC converter 110 can generate the DC intermediate voltages VHF1-VHFK to support K APT mode voltages by turn on the bypass switches 140_1-140_M in M ET system, the linear amplifiers 130_1-130_K do not provide the AC ET voltages ET_AC1-ET_ACK.

Among the bypass switches 140_1-140_M, the bypass switches 140_1-140_K are controlled to be ON while the bypass switches 140_(K+1)-140_M are controlled to be OFF for ET mode operation.

Thus, via the AC coupled or DC coupled paths, the DC ET voltage ET_DC(K+1) is combined with the AC ET voltage ET_AC(K+1) from the linear amplifier 130_(K+1) into the ET output voltage VET(K+1); . . . and via AC coupled or DC coupled paths, the DC ET voltage ET_DCM is combined with the AC ET voltage ET_ACM from the linear amplifier 130_M into the ET output voltage VETM. The ET output voltages VET1-VETK can generate APT power by the first DC-DC converter 110 via the bypass switches 140_1-140_K.

In brief, in the embodiments of the application, in one operation mode of the power supply circuit, the first DC-DC converter 110 may produce N APT output voltages VAPT1-VAPTN (N being a natural number). In other words, the power supply circuit may produce N APT output voltages VAPT1-VAPTN.

In the embodiments of the application, in another operation mode of the power supply circuit, the first DC-DC converter 110 may produce K (K being smaller than M) APT output voltages VAPT1-VAPTK by the bypass switches, the second DC-DC converter 120 may generate the (M−K) DC ET voltage ET_DC(K+1)-ET_DCM, and the linear amplifiers may generate (M−K) AC ET voltages ET_AC(K+1)-ET_ACM. In other words, the power supply circuit produce K APT output voltages VAPT1-VAPTK and produce (M−K) ET voltages VET(K+1)-VETM along with the N pure APT power.

The power supply circuit of the above embodiments of the application may provide power to multiple ET PAs (power amplifiers) and/or multiple APT PAs with less cost and more flexibility because it is enough for the power supply circuit to use a few inductors (for example, 2 inductors in FIG. 2-FIG. 4) to provide multiple ET output voltages and/or multiple APT output voltages.

Another possible embodiment of the application is directed to a wireless mobile device which includes the power supply circuit of the above embodiments of the application and a plurality of power amplification components. The plurality of power amplification components may include at least a first subset and a second subset. Each power amplification component of the first subset of the power amplification components is configured to operate according to an APT (average power tracking) mode. Each power amplification component of the second subset of the power amplification components is configured to operate according to an ET (envelop tracking) mode.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power supply circuit for a wireless mobile device having a plurality of power amplification components, wherein each power amplification component of a first subset of the power amplification components is configured to operate according to an APT (average power tracking) mode and each power amplification component of a second subset of the power amplification components is configured to operate according to either an ET (envelop tracking) mode or the APT mode, the power supply circuit including:

a first DC (direct current)-DC converter, coupled to the first subset of the power amplification components, the first DC-DC converter being configured to provide a plurality of APT output voltages and/or a plurality of DC intermediate voltages, the plurality of APT output voltages being provided to the first subset of the power amplification components, respectively;

a second DC-DC converter, coupled to the first DC-DC converter and the second subset of the power amplification components, the second DC-DC converter being configured to provide a plurality of DC components of a plurality of ET output voltages;

a plurality of linear amplifiers, coupled to the first DC-DC converter and the second subset of the power amplification components; and a plurality of bypass switches, coupled to the first DC-DC converter and the second subset of the power amplification components, for bypassing the plurality of DC intermediate voltages directly to the second subset of the power amplification components when the second subset of the power amplification components are to be operated under the APT mode, wherein when the plurality of linear amplifiers receive the plurality of DC intermediate voltages from the first DC-DC converter, the plurality of linear amplifiers provide a plurality of AC components of the plurality of ET output voltages, respectively;

wherein the plurality of DC components of the plurality of ET output voltages and the plurality of AC components of the plurality of ET output voltages are combined into the plurality of ET output voltages, respectively and the plurality of ET output voltages are provided to the second subset of the power amplification components, respectively.

2. The power supply circuit according to claim 1, further includes:

a control component, coupled to and for controlling the first DC-DC converter, the second DC-DC converter and the bypass switches.

3. The power supply circuit according to claim 2, wherein:

the second DC-DC converter is configured to provide the plurality of DC components of the plurality of ET output voltages based on the plurality of DC intermediate voltages or based on a voltage source.

4. The power supply circuit according to claim 3, further includes:

a first switch, coupled between one output of the first DC-DC converter and a first terminal of an inductor of the second DC-DC converter, the first switch being controlled by the control component for conducting one of the voltage source and the one of the plurality of DC intermediate voltages into the second DC-DC converter.

5. The power supply circuit according to claim 1, wherein the first DC-DC converter provides the N APT output voltages to the N power amplification components of the first subset of the power amplification components, respectively, N being a natural number; and the first DC-DC converter provides none of the plurality of DC intermediate voltages to the plurality of linear amplifiers.

6. The power supply circuit according to claim 1, wherein the first DC-DC converter provides the K APT output voltages to the second subset of the power amplification components by the bypass switches, respectively, the first DC-DC converter provides the M−K DC intermediate voltages to the M−K linear amplifiers, respectively, the M−K linear amplifiers provide the M−K AC components of the plurality of ET output voltages, respectively, the plurality of DC components of the plurality of ET output voltages and the M−K AC components of the plurality of ET output voltages are combined into the M−K ET output voltages and provided to the second subset of the power amplification components, respectively, and M and K are natural number, and K is smaller than or equal to M.

7. The power supply circuit according to claim 1, wherein the first DC-DC converter is a SIMO (single inductor multiple output) circuit configuration which includes a single first inductor.

8. The power supply circuit according to claim 1, wherein the second DC-DC converter is a SIMO (single inductor multiple output) circuit configuration which includes a single second inductor.

9. A power supply circuit for a wireless mobile device having a plurality of power amplification components, the power supply circuit including:
- a first DC-DC converter, coupled to the power amplification components, the first DC-DC converter being configured to provide at least one constant output voltage and/or at least one DC intermediate voltage, the at least one constant output voltage being provided to the power amplification components;
- a second DC-DC converter, coupled to the first DC-DC converter and the power amplification components, the second DC-DC converter being configured to provide a DC component of at least one time-varying output voltage; and
- at least one linear amplifier, coupled to the first DC-DC converter and the power amplification components,
- wherein when the at least one linear amplifier receives the at least one DC intermediate voltage from the first DC-DC converter, the at least one linear amplifier provides at least one AC component of the at least one time-varying output voltage;
- wherein the DC component of the at least one time-varying output voltage and the at least one AC component of the at least one time-varying output voltage are combined into the at least one time-varying output voltage and provided to the power amplification components.

10. The power supply circuit according to claim 9, further includes:
- at least one bypass switch, coupled to the first DC-DC converter and a second subset of the power amplification components, for bypassing the DC component of the at least one time-varying output voltage directly to the second subset of the power amplification components when the second subset of the power amplification components are to be operated under an APT (average power tracking) mode; and
- a control component, coupled to and for controlling the first DC-DC converter, the second DC-DC converter and the at least one bypass switch.

11. The power supply circuit according to claim 10, wherein:
- the second DC-DC converter is configured to provide the DC component of at least one time-varying output voltage based on the at least one DC intermediate voltage or based on a voltage source.

12. The power supply circuit according to claim 11, further includes:
- a first switch, coupled between one output of the first DC-DC converter and a first terminal of an inductor of the second DC-DC converter, the first switch being controlled by the control component for conducting one of the voltage source and the DC component of at least one time-varying output voltage into the second DC-DC converter.

13. The power supply circuit according to claim 9, wherein
- the first DC-DC converter is a SIMO (single inductor multiple output) circuit configuration which includes a single first inductor.

14. The power supply circuit according to claim 9, wherein
- the second DC-DC converter is a SIMO (single inductor multiple output) circuit configuration which includes a single second inductor.

\* \* \* \* \*